(12) United States Patent
Wang et al.

(10) Patent No.: US 6,995,076 B2
(45) Date of Patent: Feb. 7, 2006

(54) RELAXED SIGE FILMS BY SURFACTANT MEDIATION

(75) Inventors: Kang L. Wang, Santa Monica, CA (US); Jianlin Liu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 458 days.

(21) Appl. No.: 09/947,774

(22) Filed: Sep. 5, 2001

(65) Prior Publication Data

US 2002/0028531 A1    Mar. 7, 2002

Related U.S. Application Data

(60) Provisional application No. 60/230,626, filed on Sep. 5, 2000.

(51) Int. Cl.
   *H01L 21/205*    (2006.01)
(52) U.S. Cl. .......................................... 438/478; 117/90
(58) Field of Classification Search ................. 438/77, 438/87, 93, 478, 933, FOR. 270, FOR. 288, 438/FOR. 266; 117/90; 257/E21.093
   See application file for complete search history.

(56) References Cited

U.S. PATENT DOCUMENTS

| | | | |
|---|---|---|---|
| 5,316,615 A | | 5/1994 | Copel et al. |
| 5,548,128 A | * | 8/1996 | Soref et al. ................. 257/18 |
| 6,107,653 A | | 8/2000 | Fitzgerald |
| 6,154,475 A | * | 11/2000 | Soref et al. ................. 372/45 |

OTHER PUBLICATIONS

Jernigan G G et al: "Composition and morphology of SiGe alloys grown on Si(100) using an Sb surfactant" Journal of Crystal Growth, North-Holland Publishing Co. Amsterdam, NL, vol. 213, No. 3-4, Jun. 2000.

Sakamoto K. et al: "Which surfactant shall we choose for the heteroepitaxy of GE/SI(001)? OBI as a surfactant with small self-incorporation" Japanese Journal of Applied Physics, Publication Office Japanese Journal of Applied Physics, Tokyo, JP, vol. 32, No. 2A, part 2, Feb. 1, 1993.

Zaima S et al: "Surfactant effect of H atoms on the suppression of GE segregation in SI overgrown on FE (N ML)/SI (100) substrates by gas source molecular beam epitaxy" Journal of Crystal Growth, North-Holland Publishing Co. Amsterdam, NL, vol. 150, No. 1/4, part 2 May 1, 1995.

J.L. Liu et al., "High-quality Ge films on Si substrates using Sb surfactant-mediated graded SiGe buffers," *Applied Physics Letters* 79(21):3431-3433 (2001).

J.L. Liu et al., "Experimental study of a surfactant-assisted SiGe graded layer and a symmetrically strained Si/Ge superlattice for thermoelectric applications," *Thin Solid Films* 369(2000):121-125 (2000).

J.L. Liu et al., "Growth study of surfactant-mediated relaxed SiGe graded layers for 1.55-$\mu$m photodetector applications," *Thin Solid Films* 380 (2000):54-56 (2000).

J.L. Liu et al., "A surfactant-mediated relaxed $Si_{0.5}Ge_{0.5}$ graded layer with a very low threading dislocation density and smooth surface," *Applied Physics Letters* 75(11):1586-1588 (1999).

* cited by examiner

*Primary Examiner*—George Fourson
(74) *Attorney, Agent, or Firm*—Fulbright & Jaworski (57) ABSTRACT

A metallic surfactant, e.g., Sb, Bi, As, or atomic hydrogen is used to grow a high quality, relaxed, relatively thin SiGe buffer having a very smooth surface and a very low threading dislocation density, on which high-quality films are epitaxially grown for various applications.

19 Claims, 9 Drawing Sheets

RELAXED SIGE FILMS BY SURFACTANT MEDIATION

CROSS REFERENCES WITH RELATED APPLICATIONS

This application claims the benefit of U.S. Provisional Application No. 60/230,626, filed Sep. 5, 2000, which is incorporated herein by reference.

STATEMENT REGARDING FEDERALLY SPONSORED RESEARCH OR DEVELOPMENT

This invention was made with Government support under Grant No. N00014-97-1-0516, awarded by the Office of Naval Research—MURI. The Government has certain rights in this invention.

BACKGROUND OF THE INVENTION

1. Field of the Invention

The field of the invention is the fabrication of SiGe buffers.

2. Description of the Related Art

Relaxed SiGe has become an important material for various device applications. To date, strain-relaxed SiGe buffers have been realized by at least three methods. One method is to grow compositionally graded SiGe layers at high temperatures (typically at 700° C. to 900° C.) with a typical grading rate of 10% Ge per 1 μm via ultra-high vacuum chemical vapor deposition (UHVCVD) [E. A. Fitzgerald, et al., *J. Vac. Sci. Technol.* B 10, 1807(1992); U.S. Pat. No. 6,107,653 to Fitzgerald; and M. T. Currie, et al., *Appl Phys. Lett.*, 72, 1718(1998)]. Another method uses a low temperature Si buffer (typically grown below 400° C.) underneath a SiGe layer of constant composition grown at about 550° C. [J. H. Li, et al., *Appl. Phys. Lett.*, 71,3132 (1997)]. Still another method introduces impurities, such as carbon, in SiGe layers to adjust the strain [H. J. Osten, and E. Bugiel, *Appl. Phys. Lett.* 70, 2813(1997)].

These techniques have certain disadvantages which include long growth times, thick buffer layers, rough surfaces, high residual strain degree, and/or high threading dislocation densities. Obviously, long growth time and thick buffers result in low efficiency, high costs, and low yields. In addition, devices grown on these buffers are likely to perform poorly as a result of the high threading dislocation density and surface roughness. Previously, it was shown that a segregating species, such as a metallic surfactant, can be used to inhibit island formation in strain layer heteroepitaxy [E. Tournie, K. Ploog, *Thin Solid Films*, 231, 43(1993)]. Therefore, there is a need for an improved method for improving graded buffer layers with a high grading rate in their properties including improving surface roughness and threading dislocation densities.

BRIEF SUMMARY OF THE INVENTION

The present invention describes the use of a metallic surfactant to grow high quality relaxed oriented SiGe buffers. More particularly, the invention comprises the use of metallic surfactants, such as, Sb, Bi, As, or atomic hydrogen (H$^+$) for improving graded buffer layers with a high grading rate in their properties including surface roughness and threading dislocation densities. Graded SiGe can be grown to high Ge content layers, including pure Ge using such previously disclosed metallic surfactants and controlling the temperature and temperature cycles. One typical temperature cycle, a flash-off technique, occurs by increasing the growth temperature slowly from about 500° C. to 800° C., preferably to about 700° C., keeping the substrate temperature at that point for about 5–10 minutes and then to decreasing the temperature back to about 500° C. The growth of process is illustrated with a Si(100) substrate but can be applied to other oriented substrates such as Si(111), Si(110) or Si on insulator (SOI) substrates. In a particular embodiment, a flash-off technique is used at the end of grading to reduce the incorporation of doping for subsequent epilayer growth.

Thus, this invention provides a method for processing a relatively thin SiGe buffers, with a very smooth surface and a very low threading dislocation density, on which high-quality films can be epitaxilly grown for various applications.

These and other features, aspects, and advantages of the present invention will become better understood with regard to the following detailed description, appended claims, and accompanying drawings.

DETAILED DESCRIPTION OF THE INVENTION

Figure 1:
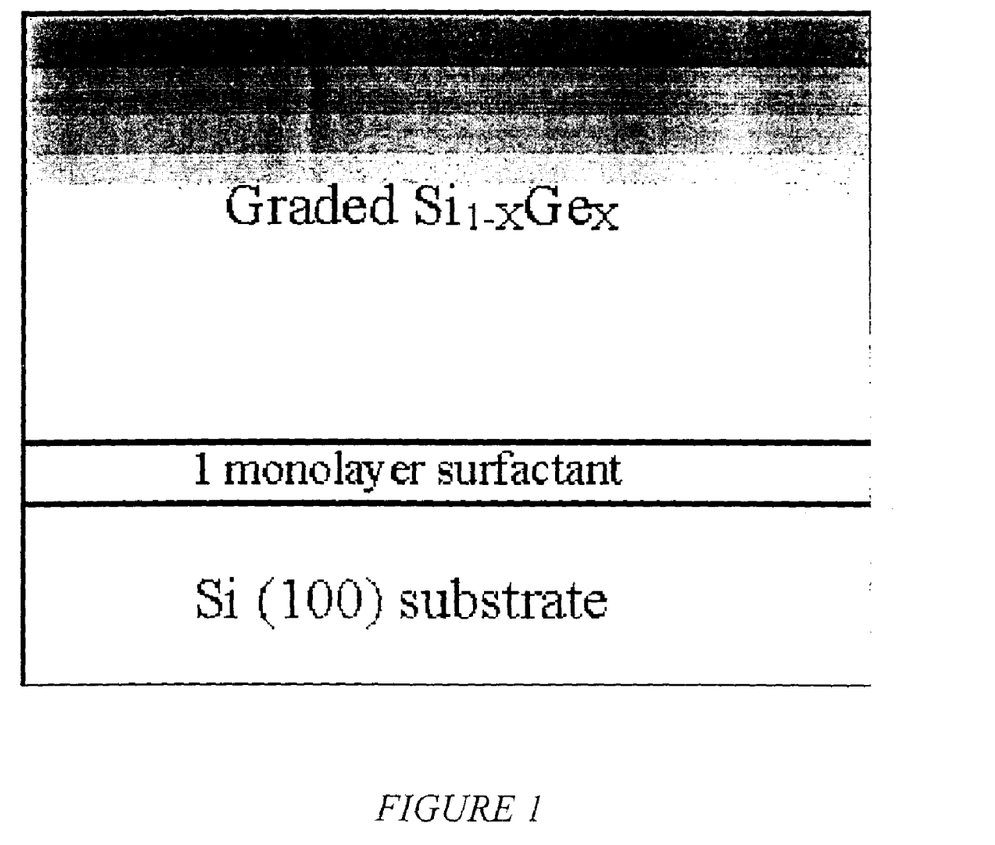
FIG. 1 is a schematic of a metallic surfactant-assisted relaxed SiGe buffer.

The present invention describes a technique of fabricating thin, high-quality, relaxed SiGe buffers. The schematic diagram of this approach is demonstrated in FIG. 1. High-quality, relaxed SiGe buffers, are realized by the deposition of 1 monolayer metallic surfactant (middle layer), followed by a compositionally graded SiGe with a high grading rate. The film is grown at low temperatures, typically about 500° C. In cases needing low-doping SiGe buffers, integration of the previously disclosed flash-off technique is necessary; see Brandt, et al., *Phys. Rev.* B. 45, 8443(1992). Again, the flash-off technique occurs by increasing the growth temperature slowly from about 500° C. to 800° C., preferably to about 700° C., keeping the substrate temperature at that point for about 5–10 minutes and then to decreasing the temperature back to about 500° C. For example, during the SiGe compositional-grading growth process, a temperature cycling procedure allows for all the metallic surfactants to "flash-off", resulting in a low-doping buffer on top.

The present invention has several advantages over the previous arts. Firstly, this technique exploits a high grading rate, typically about 25% to 50% Ge per 1 μm buffer, resulting in thin buffers with low costs and high yields. Secondly, low temperature growth processes can be integrated into any type of current processing technology, thus requiring lower thermal budgets. Finally, the quality of the buffers disclosed by the present invention is greatly improved (typically in the orders of magnitude) in terms of both threading dislocation density and surface roughness.

The following examples will serve to further illustrate the nature of the invention, but is not limited on the scope thereof, which is defined solely by the claims.

EXAMPLE 1

The present invention is tested by fabricating a high-quality, relaxed $Si_{0.5}Ge_{O.5}$ buffer; [see J. L. Liu, C. D. Moore, G. D. U'Ren, Y. H. Luo, Y. Lu, G. Jin, S. G. Thomas, A S. Goorsky, and K. L. Wang, *Appl. Phys. Lett.* 75, 1586(1999)]. The growth is carried out using a solid source molecular beam epitaxy (MBE) system. The substrate temperature is kept at about 510° C. during the growth step. The 1 monolayer Sb step is grown on a Si(100) substrate. This is followed by about an 2-μm-thick linearly graded SiGe, with the Ge mole fraction varying from about 0.0 to 0.5 and the grading rate is about 25% Ge per 1 μm buffer. Finally, about an 0.3-μm-thick constant $Si_{0.5}Ge_{O.5}$ film is grown.

Figure 2:
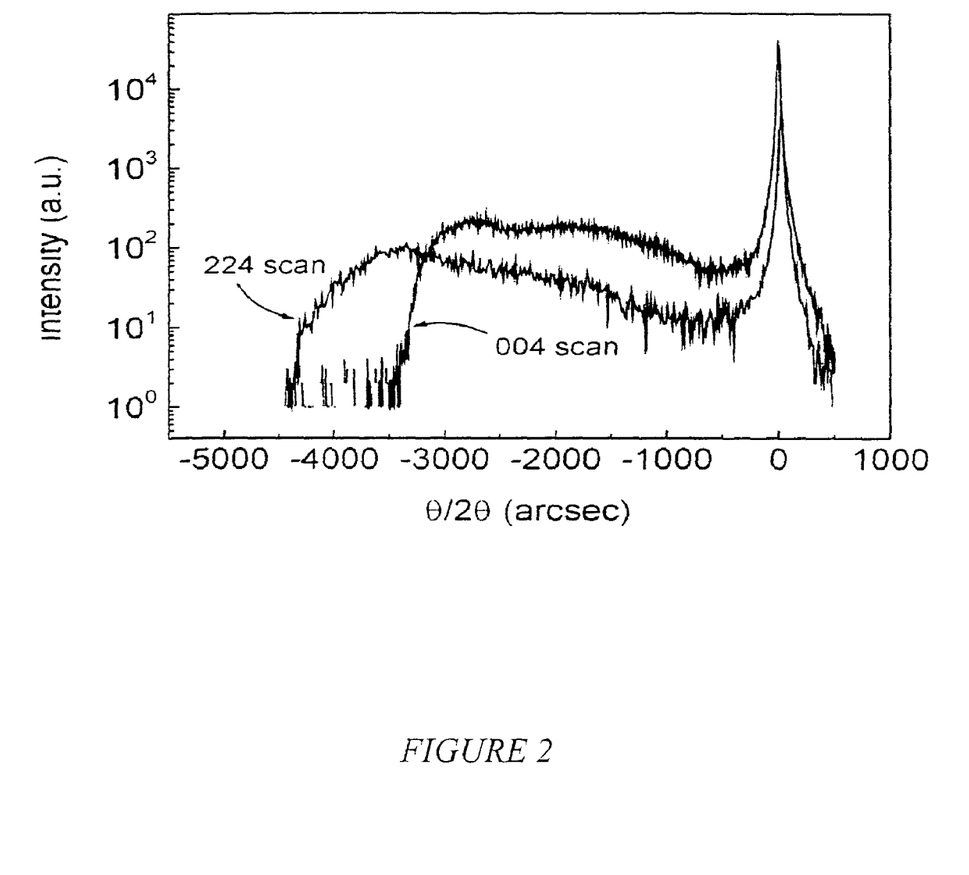
FIG. 2 is an X-ray (004) and (224) rocking curves of a relaxed $Si_{0.5}Ge_{O.5}$ sample.
Figure 3:
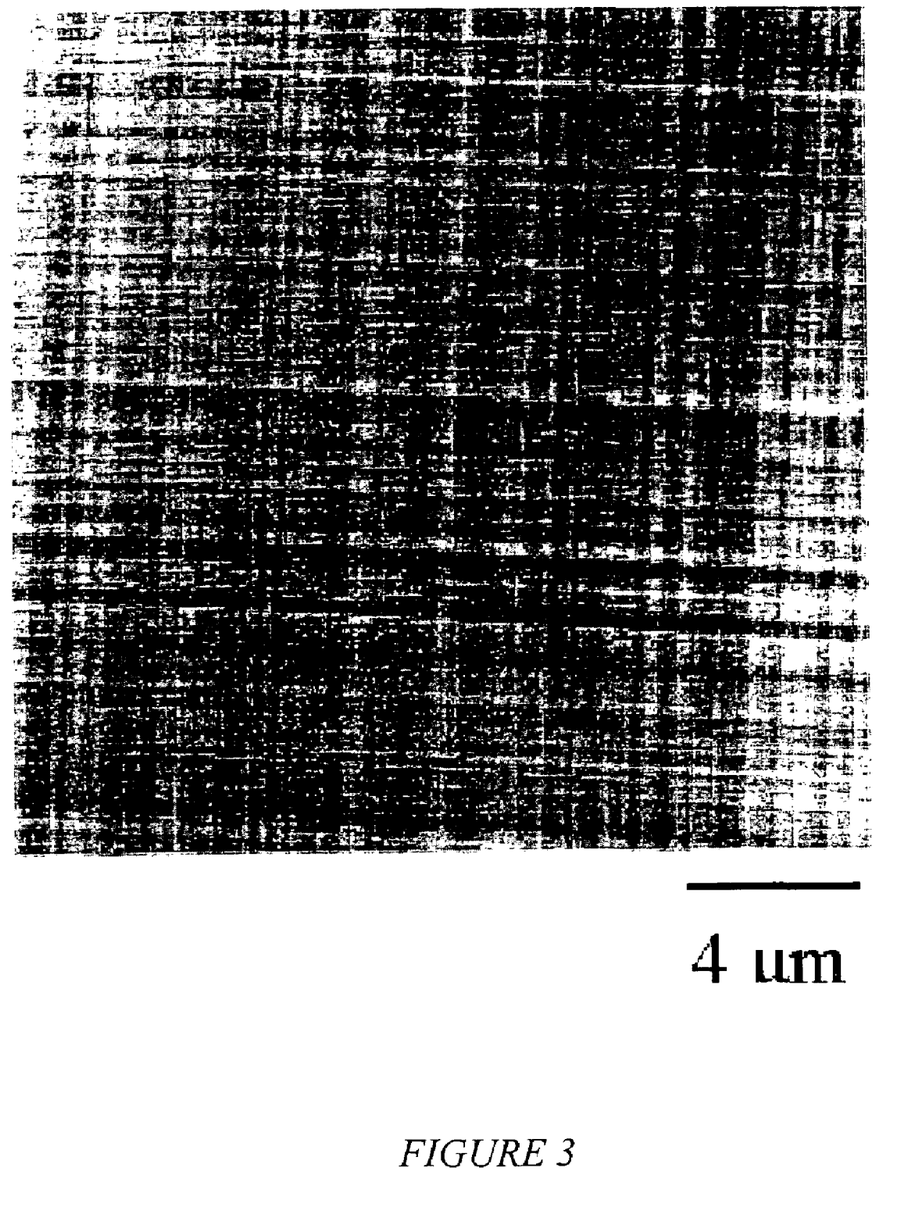
FIG. 3 is an atomic force microscopy (AFM) image of the relaxed $Si_{0.5}Ge_{O.5}$ sample.

FIG. 2 shows the symmetric (004) and (224) rocking curves of the $Si_{0.5}Ge_{O.5}$ sample. The layer peak position in these scans corresponds to a Ge mole fraction of 0.49 and a relaxation of 95%. FIG. 3 shows the $Si_{0.5}Ge_{O.5}$ sample surface morphology is clearly seen using an AFM measurement. The cross hatch lines in the AFM image occur along two in-plane <110> directions and are long and straight, indicating potentially few threading dislocations in the sample. Surface roughness of the $Si_{0.5}Ge_{O.5}$ sample is estimated from a number of 20×20 μm² AFM images to be about 20 Å. This value is almost one order of magnitude lower than that by conventional growth techniques; where a buffer graded with a smaller grading rate of 10% Ge per 1 μm and grown at 750° C. to a final Ge concentration of 50% had a surface roughness of 373 Å. Using the above described method, SiGe detectors can be grown on Si for 1.3 μm and 1.55 μm communication applications.

Figure 4:
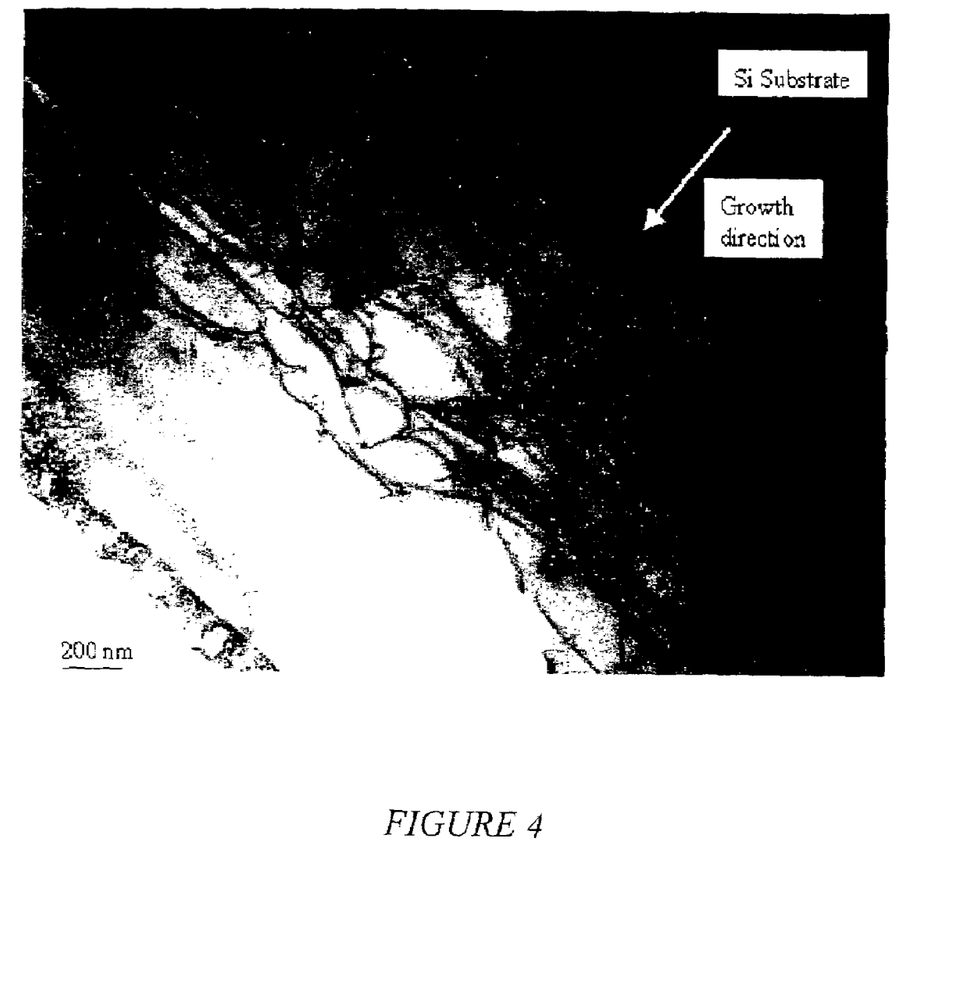
FIG. 4 is a cross-sectional TEM image of the relaxed $Si_{0.5}Ge_{O.5}$ sample.
Figure 5:
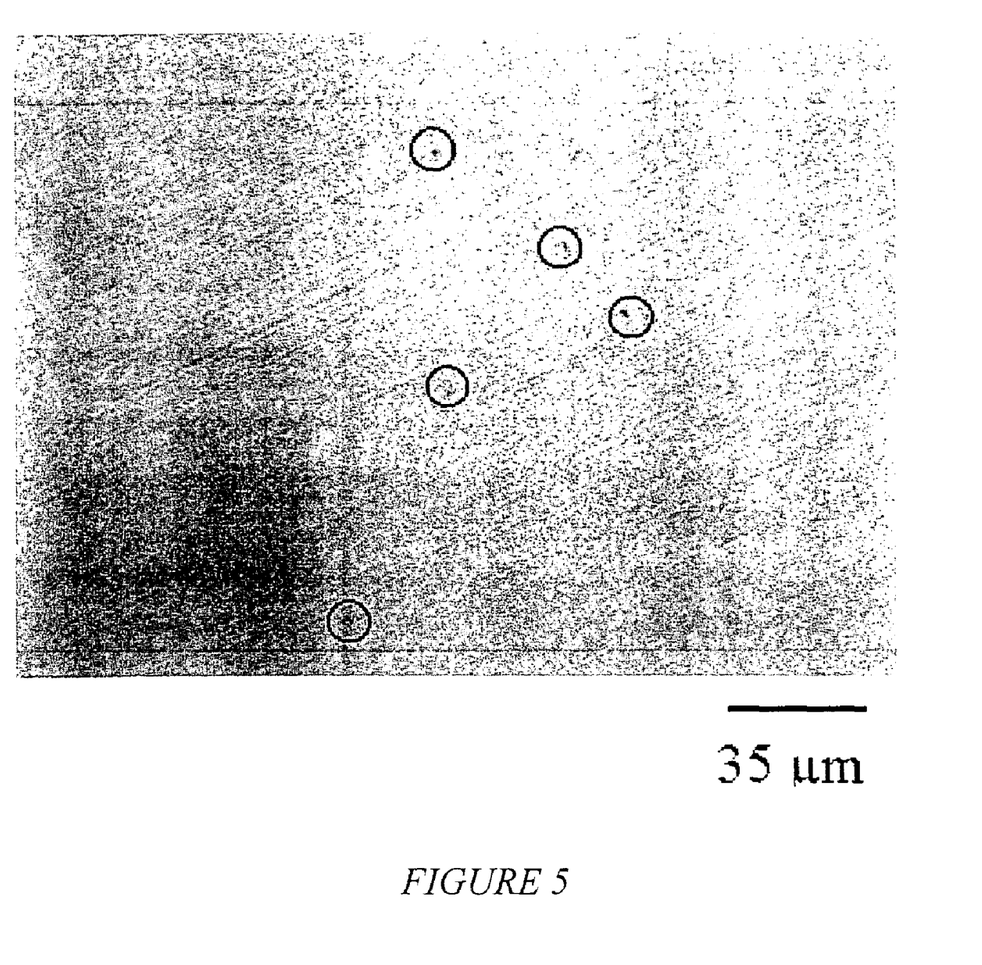
FIG. 5 is a Nomarski optical micrograph of an etched relaxed $Si_{0.5}Ge_{O.5}$ sample depicting etched pits in the circles.

FIG. 4 shows a cross-sectional transmission electron microscopy (TEM) image of the $Si_{0.5}Ge_{O.5}$ sample. Most of the threading dislocations are located near the substrate and few propagate into the top layer, resulting in a dislocation-free top layer. Also, the qualitative threading dislocation density is obtained by using a Schimmel defect etch, and then counting the etched pit density with Nomarski interference microscopy; [see D. Schimmel, *J. Electrochem. Soc.*, 479(1979)]. A typical Nomarski image of the as-etched $Si_{0.5}Ge_{O.5}$ sample is shown in FIG. 5. The threading dislocation density in the upper graded layer, estimated by Alpha step measurement, was determined to be about $1.5 \times 10^4$ $cm^{-2}$. This number is at least two orders of magnitude lower than that in previously reported graded buffer layers grown at high temperatures [see M. T. Currie, et al., *Appl. Phys. Lett.*, 72, 1718(1998)].

EXAMPLE 2

Using the method as described in Example 1, SiGe detectors can be grown on Si for 1.3 μm wavelength and 1.55 μm wavelength communication applications.

EXAMPLE 3

Pure Ge photodetectors

Using the method as described in Example 1, Ge detectors can be grown on Si for 1.3 μm wavelength and 1.55 μm wavelength communication applications. Specifically, pure Ge p-i-n photodetectors with very low dark current and high quantum efficiency were fabricated using surfactant-mediated graded SiGe films. The structure consisted of the following layers: about a 100-nm-thick Si buffer, linearly graded $Si_{1-X}Ge_X$ with X from about 0 to 1 (the top about 0.6-μm-thick buffer was doped with Sb of about $0.7-1 \times 10^{17}$ $cm^{-3}$ to form n layer), about 0.8-μm-thick undoped Ge and about 0.1-μm-thick B-doped $p^+$ Ge with a doping density of about $5 \times 10^{18}$ $cm^{-3}$. The thickness of the linearly graded buffer part can be tailored at will. The thickness of the buffer layer is very critical for controlling threading dislocation density and surface roughness. Similar to graded SiGe buffers grown by other methods, surfactant-mediated SiGe graded buffer has a certain dependence of the thickness on the resulting threading dislocation density and surface roughness. The thicker the buffer, the lower the threading dislocation density and the smoother the surface. The present invention has the advantage of reducing the buffer layer significantly, while obtaining a high-quality buffer for various applications.

Figure 6A:
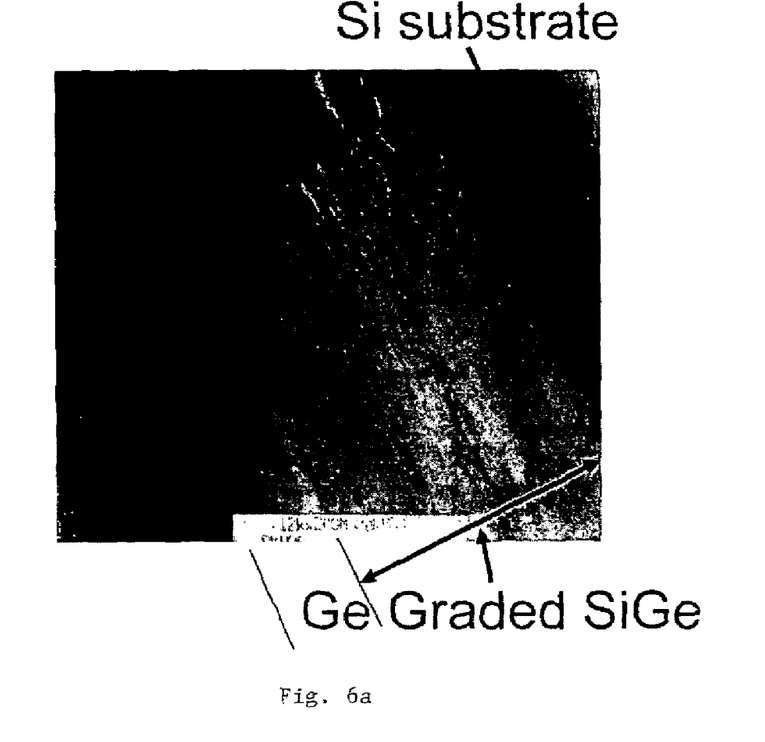
FIGS. 6*a–b* are bright field cross-sectional TEM images of the p-i-n Ge film with a 4 μm Sb mediated graded SiGe buffer; Lower magnification image shows the whole as-grown film (FIG. 6*a*); and higher magnification image shows the upper graded layer and pure Ge part only (FIG. 6*b*)
Figure 6B:
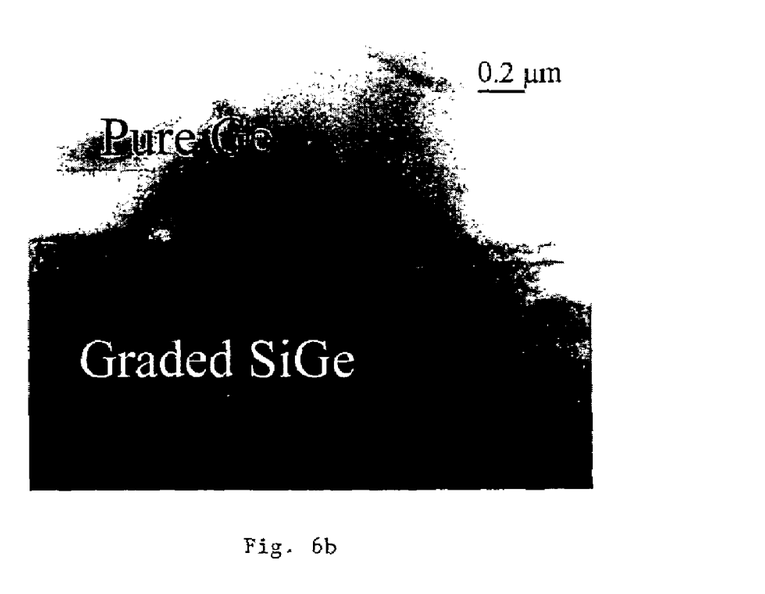

FIGS. 6a–b show bright-field cross-sectional TEM of the p-i-n Ge film with a 4 μm Sb mediated graded SiGe buffer. Lower magnification image shows the whole as-grown film (FIG. 6a); and higher magnification image shows the upper graded layer and pure Ge part only (FIG. 6b). Dislocation-free film is obtained from the TEM point of view. A large density of threading dislocations is clearly seen in the graded buffer region only, i.e., the top 0.9 μm pure Ge film is of high quality with a very low threading dislocation density, beyond the ability of the TEM method.

Figure 7:
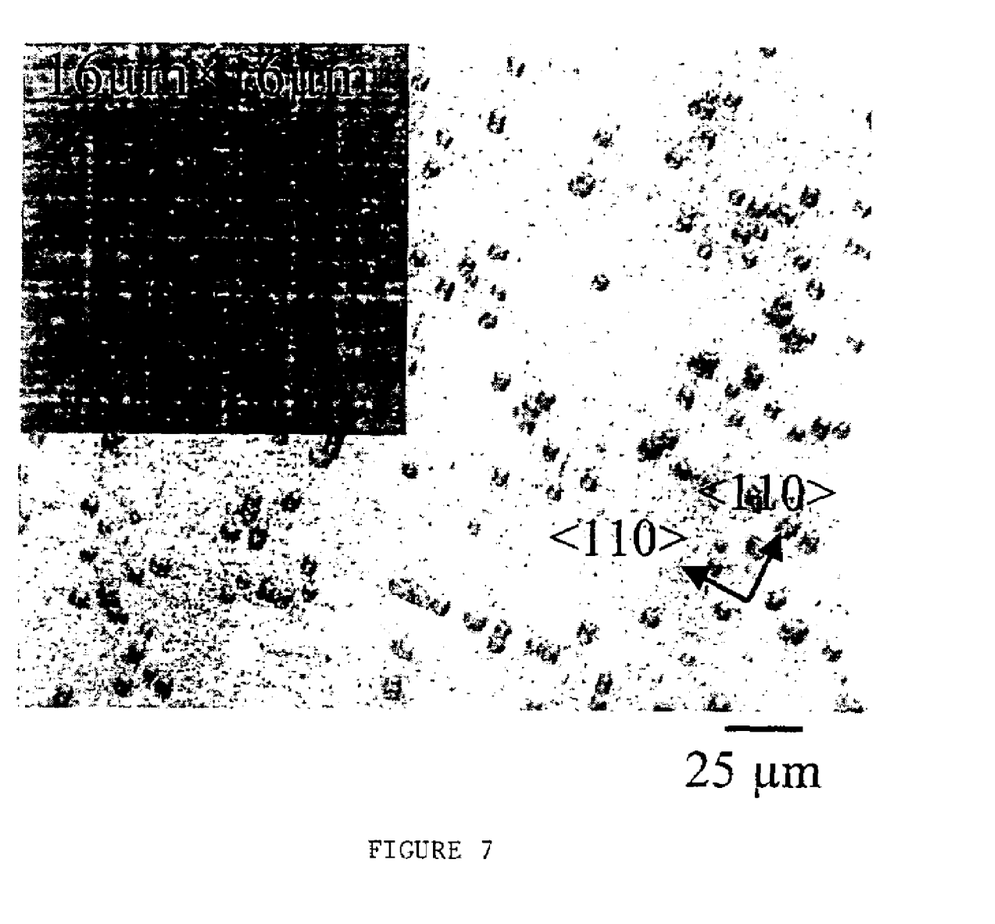
FIG. 7 is a Nomarski optical micrograph of the etched Ge film with a 4 μm buffer indicating I-coated pits arising from threading dislocations; the threading dislocation density is estimated to be 5.4×10$^5$ cm$^{-2}$, the inset shows the as-grown sample surface showing the surface roughness to be 35 Å.

In order to characterize the low dislocation density, Nomarski optical micrograph of the etched Ge film with a 4 μm buffer was taken in FIG. 7. The selective etchant used was a mixture of $CH_3COOH$, $HNO_3$, HF, and $I_2$ [Hsin-Chiao Luan, et al., Appl. Phys. Lett. 75, 2909(1999)]. FIG. 7 shows I-coated pits arising from threading dislocations and the threading dislocation density was obtained by counting the I-decorated pits on the surface and determined to be about $5.4 \times 10^5$ $cm^{-2}$. The inset of FIG. 7 shows an AFM image of an as-grown sample surface with the 4 μm graded buffer. Long and straight misfit dislocation lines are evident. The root mean square (RMS) surface roughness was measured to be 35 Å.

Figure 8A:
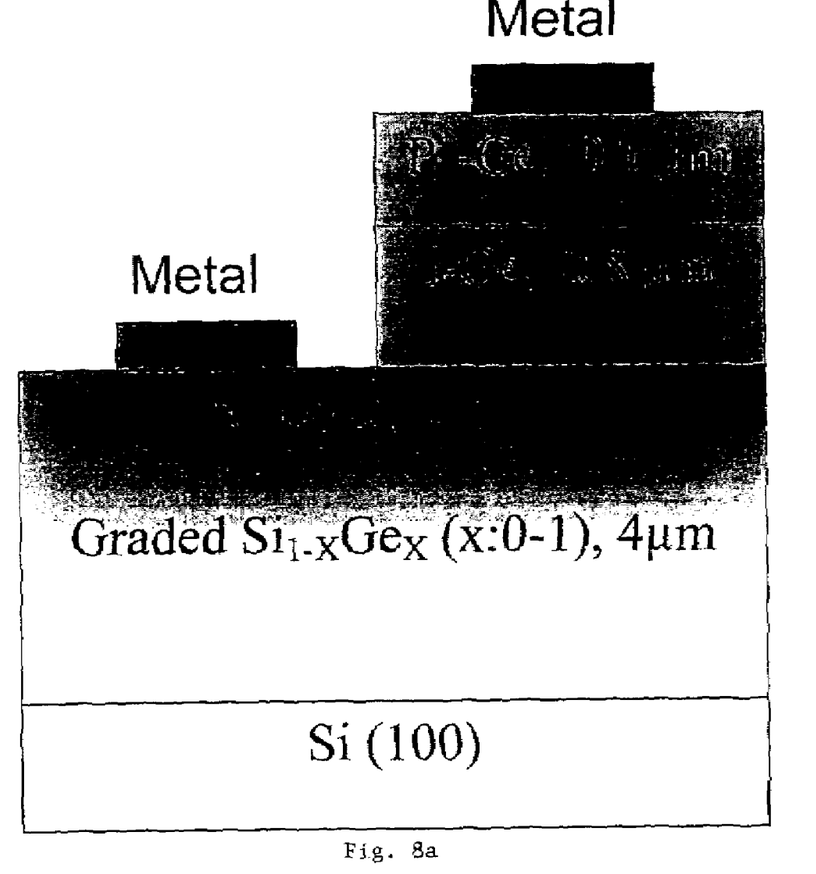
FIGS. 8*a–b* are a schematic of the fabrication of the detector (FIG. 8*a*) and a top view of the mesa after the etching (FIG. 8*b*)
Figure 8B:
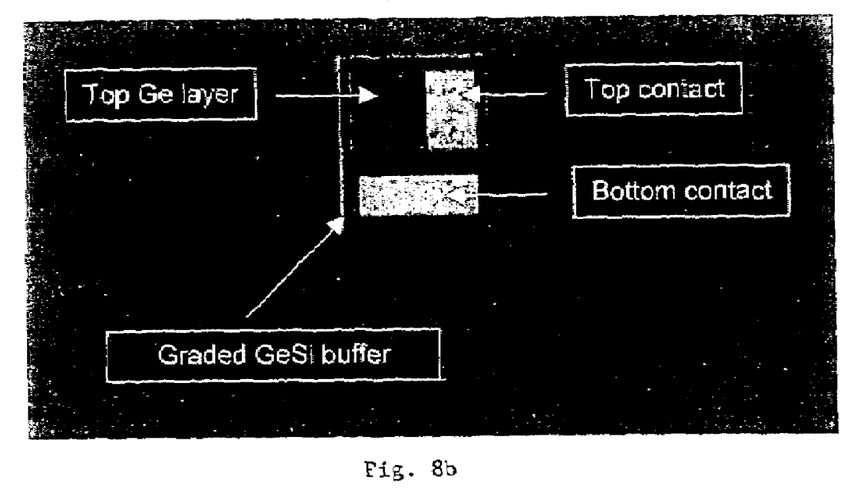
Figure 9:
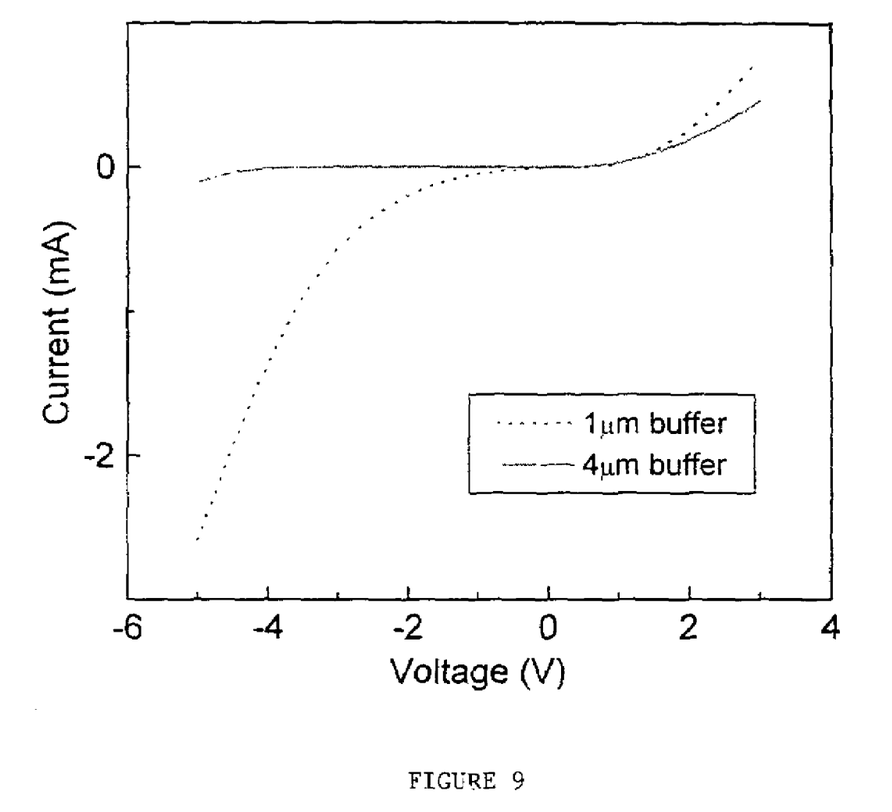
FIG. 9 is a graph showing the current-voltage characteristics of p-i-n Ge diodes fabricated on two Sb-mediated samples with 4 μm and 1 μm buffer, respectively.

The as-grown pure Ge film was fabricated into Ge p-i-n mesa diodes with 100 μm×200 μm in size. FIG. 8a is a schematic of the fabrication of the detector. Wet etching with a mixture of $HNO_3$, $CH_3COOH$ and HF is used in defining the mesa and Ti/Al is the contact metal. FIG. 8b shows an optical microscopy image of the top view of the mesa structure. FIG. 9 shows I-V measurement results, i.e., the current-voltage characteristics of p-i-n Ge diodes fabricated on two Sb-mediated samples with 4 μm and 1 μm graded buffers, respectively. The dark current density at a reverse bias of 1 volt was determined to be about 0.15 and 3.44 mA/cm$^2$ for the Sb-mediated samples with the 4 μm and 1 μm graded buffer, respectively.

The dark current density from the sample from the present invention with a 100% Ge per 1 μm steep grading rate was several times lower than the previously reported values of 200 mA/cm$^2$ [S. Luryi, et al., IEEE Trans. Electron Devices ED, 31, 1135(1984)] and 50 mA/cm$^2$ [P. Sutter, et al., Solar Energy Materials and Solar Cells, 31, 541(1994)]. The sample with a 25% Ge per 1 μm grading rate exhibited a very low dark current density, close to the ideal dark diffusion current density of 0.03 mA/cm$^2$ based on our doping profile. Minority carrier lifetime $\tau_p$ of $10^{-7}$ seconds was used in our calculation. The internal quantum efficiency was measured to be as high as 70% at 1.55 μm for the diodes with the 4 μm SiGe buffer. The detector response as determined by the RC constant was about 2.3 GHz.

EXAMPLE 4

Using the method as described in Example 1, high Ge content $Si_{1-x}Ge_x/Si_{1-y}Ge_y/Si_{1-z}Ge_z$ heterojunction bipolar transistors (HBTs) can be prepared. X, y, and z are any numbers between 0 and 1. Preferably, y is greater than x and z. X and z can be equal or different. HBTs fabricated with higher y value exhibit higher cut-off frequency.

EXAMPLE 5

Using the method as described in Example 1, III-IV opto-electronic devices such as light emitting diodes (LEDs) integrated on Si substrate can be prepared using SiGe buffers graded to pure Ge.

The following references are incorporated herein by reference: O. Brandt, K. Ploog, L. Tapfer, M. Hohenstein, R. Bierwolf and F. Phillipp, *Phys. Rev.* B. 45, 8443(1992); M. T. Currie, S. B. Sarnavedam, T. A. Langdo, C. W. Leitz, and M. T. Currie, et al., *Appl. Phys. Lett,* 72, 1718(1998); U.S. Pat. No. 6,107,653 to Fitzgerald; E. A. Fitzgerald, Y.-H. Xie, D. Monroe, P. J. Silverman, J. M. Kuo, A. R. Kortan, F. A. Thiel, and B. E. Weir, *J. Vac. Sci. Technol.* B 10, 1807(1992); J. H. Li, C. S. Peng, Y. Wu, D. Y. Dai, J. M. Zhou, and Z. H. Mai, *Appl. Phys. Lett.,* 71,3132(1997); J. L. Liu, C. D. Moore, G. D. U'Ren, Y. H. Luo, Y. Lu, G. Jin, S. G. Thomas, A S. Goorsky, and K. L. Wang, *Appl. Phys. Lett* 75, 1586(1999); H. J. Osten, and E. Bugiel, *Appl. Phys. Lett.* 70, 2813(1997); D. Schimmel, *J. Electrochem. Soc.,* 479(1979); E. Tournie, K. Ploog, *Thin Solid Films,* 231, 43(1993); Hsin-Chiao Luan, D. R. Lim, K. K. Lee, K. M. Chen, J. G. Sandland, K. Wada, and L. C. Kirmerling, *Appl. Phys. Lett.* 75, 2909(1999); S. Luryi, A. Katalsky, and J. C. Bean, IEEE Trans. Electron Devices ED-31, 1135(1984); and P. Sutter, U. Kafader, and H. Von Kanel, Solar Energy Materials and Solar Cells 31, 541(1994).

Although the foregoing invention has been described in some detail by way of illustration and example for purposes of clarity and understanding, it will be obvious that various modifications and changes which are within the knowledge of those skilled in the art are considered to fall within the scope of the appended claims.

The invention claimed is:

1. A method for producing a SiGe buffer film comprising:

a) depositing a layer of surfactant on a substrate, said surfactant selected from the group consisting of metallic surfactants and atomic hydrogen; and b) growing a film of Ge-composition-graded SiGe on the layer of surfactant.

2. The method of claim 1, further comprising after step b, the step of flashing off the layer of surfactant whereby to reduce doping.

3. The method of claim 1, wherein said surfactant layer and graded SiGe film are formed at a temperature in the range of about 500° C. to 560° C.

4. The method of claim 1, wherein said surfactant is Sb, Bi, As or atomic hydrogen.

5. The method of claim 1, wherein the grading rate of said SiGe buffer film contains from about 25% to 50% Ge per 1 μm of buffer.

6. The method of claim 1, further comprising, after step b, depositing a layer of SiGe alloy having the same Ge composition as a final Ge composition of the graded SiGe film of step b.

7. The method of claim 1, wherein the substrate temperature is increased from a growth temperature of about 500° C. to a temperature of about 700° C.

8. A method for producing a SiGe buffer film comprising:

a) depositing a layer of surfactant on a substrate, wherein the surfactant is Sb, Bi, As, or atomic hydrogen;

b) growing a film of Ge-composition-graded SiGe on the layer of surfactant; and c) flashing off the layer of surfactant.

9. The method of claim 8, wherein said surfactant and graded SiGe film are formed at a temperature in the range of about 500° C. to 560° C.

10. The method of claim 8, wherein the grading rate of said SiGe buffer film contains from about 25% to 50% Ge per 1 μm of buffer.

11. The method of claim 8, wherein a final Ge composition of the graded SiGe film is pure Ge and further comprising, after step b, depositing a layer of pure Ge on top of the graded SiGe film.

12. The method of claim 8, wherein the substrate temperature is increased from a growth temperature of about 500° C. to a temperature of about 700° C.

13. The method of claim 8, wherein the substrate is Si(100) or Si on insulator.

14. The method of claim 8, wherein the flashing off of step c involves a cycle of increasing the substrate temperature from a growth temperature and then decreasing the temperature back to the growth temperature.

15. A method for producing a SiGe buffer film comprising:

a) depositing a layer of surfactant on a substrate, wherein said surfactant is selected from the group consisting of metallic surfactants and atomic hydrogen, and wherein said substrate is Si(100) or Si on insulator; and b) Ge-composition-graded SiGe to any final Ge composition on the layer of surfactant.

16. The method of claim 15, further comprising, after step b, depositing a layer of SiGe alloy having the same Ge composition as the final Ge composition of step b.

17. The method of claim 1, wherein the substrate is Si(100) or Si on insulator.

18. The method of claim 15, wherein the substrate temperature is lowered to about 400° C.

19. The method of claim 15, wherein said surfactant is Sb, Bi, As or atomic hydrogen.

* * * * *